United States Patent
Holzmann et al.

(10) Patent No.: US 9,684,251 B2
(45) Date of Patent: Jun. 20, 2017

(54) MICROLITHOGRAPHIC PROJECTION EXPOSURE APPARATUS AND METHOD OF CORRECTING OPTICAL WAVEFRONT DEFORMATIONS IN SUCH AN APPARATUS

(71) Applicant: Carl Zeiss SMT GmbH, Oberkochen (DE)

(72) Inventors: Joerg Holzmann, Aalen-Unterkochen (DE); Robert Weiss, Waldbronn (DE); Toralf Gruner, Aalen-Hofen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 2 days.

(21) Appl. No.: 15/056,085

(22) Filed: Feb. 29, 2016

(65) Prior Publication Data

US 2016/0179018 A1   Jun. 23, 2016

Related U.S. Application Data

(63) Continuation of application No. PCT/EP2013/002693, filed on Sep. 9, 2013.

(51) Int. Cl.
*G03B 27/54* (2006.01)
*G03F 7/20* (2006.01)

(52) U.S. Cl.
CPC ...... *G03F 7/70891* (2013.01); *G03F 7/70308* (2013.01); *G03F 7/70808* (2013.01)

(58) Field of Classification Search
CPC ............ G03F 7/70891; G03F 7/70808; G03F 7/70308

(Continued)

(56) References Cited

U.S. PATENT DOCUMENTS 6,338,823 B1  1/2002  Furukawa
6,504,597 B2  1/2003  Schuster et al.
(Continued)

FOREIGN PATENT DOCUMENTS

EP     1 524 558 A1    4/2005
WO  WO 03/075096 A2    9/2003
(Continued)

OTHER PUBLICATIONS

International Search Report for corresponding PCT Appl No. PCT/EP2013/002693, dated Jun. 4, 2014.

*Primary Examiner* — Hung Henry Nguyen
(74) *Attorney, Agent, or Firm* — Fish & Richardson P.C.

(57) ABSTRACT

A microlithographic projection exposure apparatus includes a correction device configured to correct optical wavefront deformations. The correction device includes first and second optical elements and a drive mechanism configured to move the first and second optical elements between a first arrangement and a second arrangement. In the first arrangement the first optical element is an inner optical element having at least a portion that is arranged in a projection light path, and the second optical element is an outer optical element that is arranged completely outside the projection light path. In the second arrangement the second optical element is the inner optical element, and the first optical element is the outer optical element. The correction device further includes a temperature control device configured to modify a temperature distribution in the outer optical element.

24 Claims, 12 Drawing Sheets

(58) Field of Classification Search
 USPC .............................. 355/30, 52, 53, 55, 67–71
 See application file for complete search history.

(56) References Cited

U.S. PATENT DOCUMENTS

| | | |
|---|---|---|
| 6,665,126 B2 | 12/2003 | Shafer et al. |
| 2003/0128349 A1 | 7/2003 | Unno |
| 2008/0273180 A1 | 11/2008 | Roux |
| 2009/0257032 A1 | 10/2009 | Eva et al. |
| 2010/0014065 A1 | 1/2010 | Gruner et al. |
| 2010/0128367 A1 | 5/2010 | Beckenbach et al. |
| 2010/0201958 A1 | 8/2010 | Hauf et al. |
| 2014/0327892 A1* | 11/2014 | Walter .................. G02B 7/028 355/30 |

FOREIGN PATENT DOCUMENTS

| | | |
|---|---|---|
| WO | WO 2005/069055 A2 | 7/2005 |
| WO | WO 2011/116792 A1 | 9/2011 |
| WO | WO 2013/044936 A1 | 4/2013 |

* cited by examiner

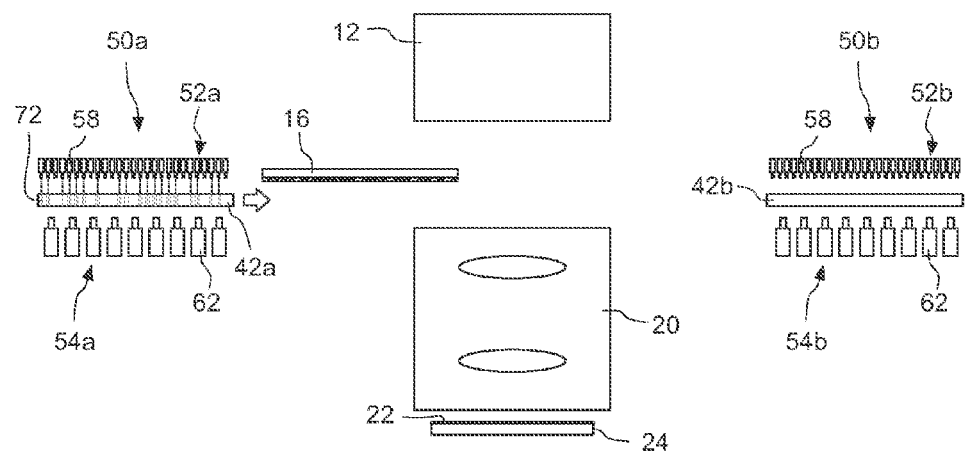
Fig. 3a
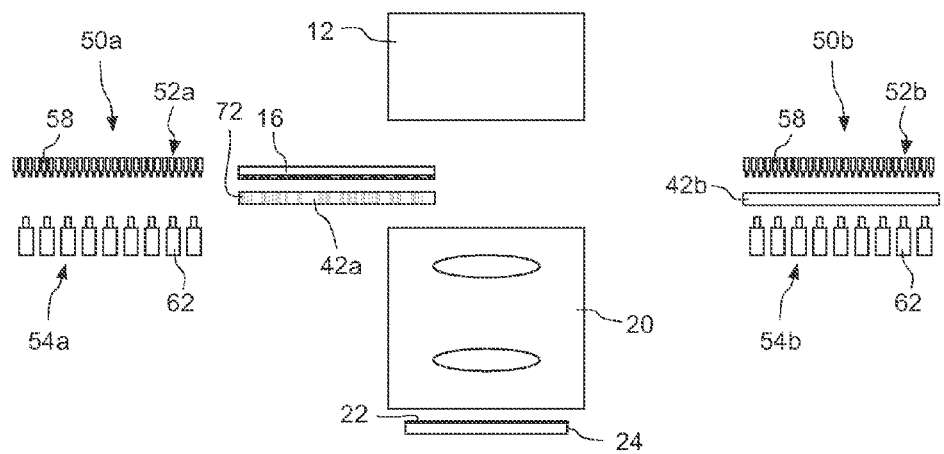
Fig. 3b
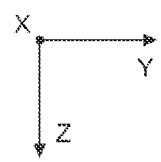

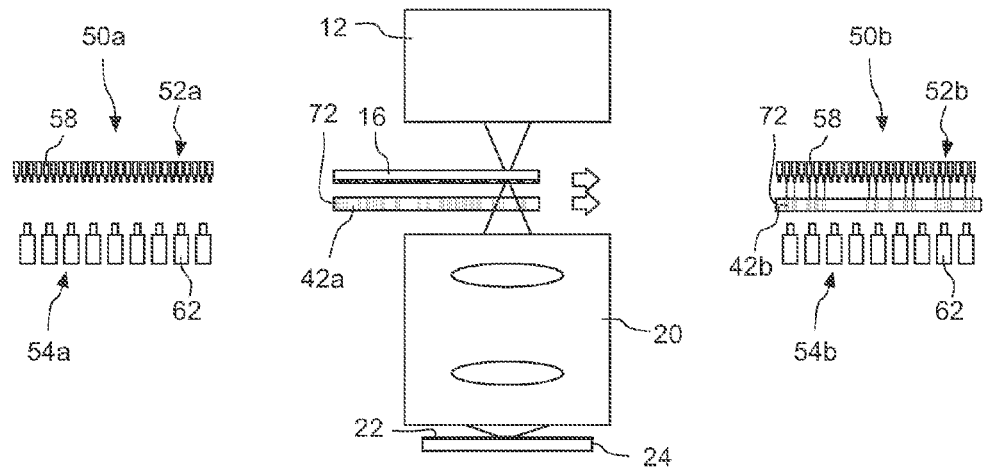
Fig. 3c
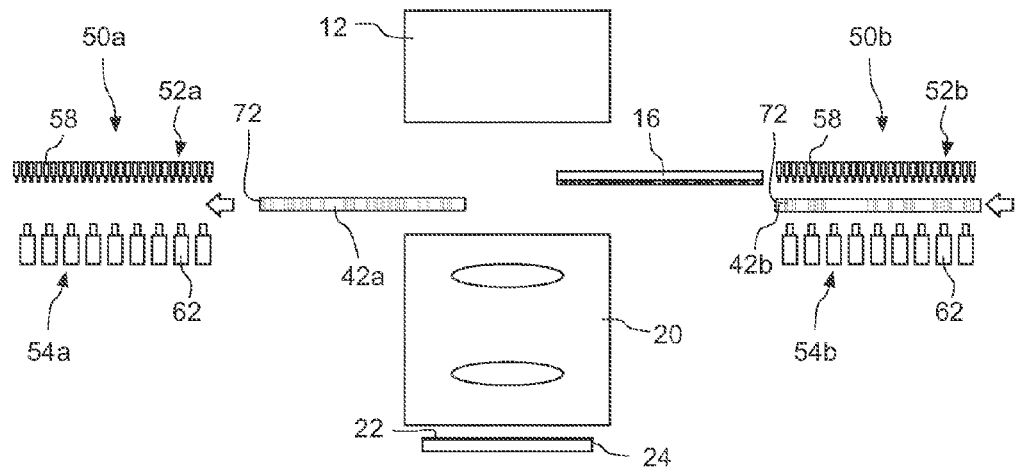
Fig. 3d
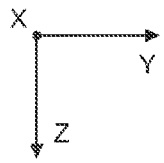

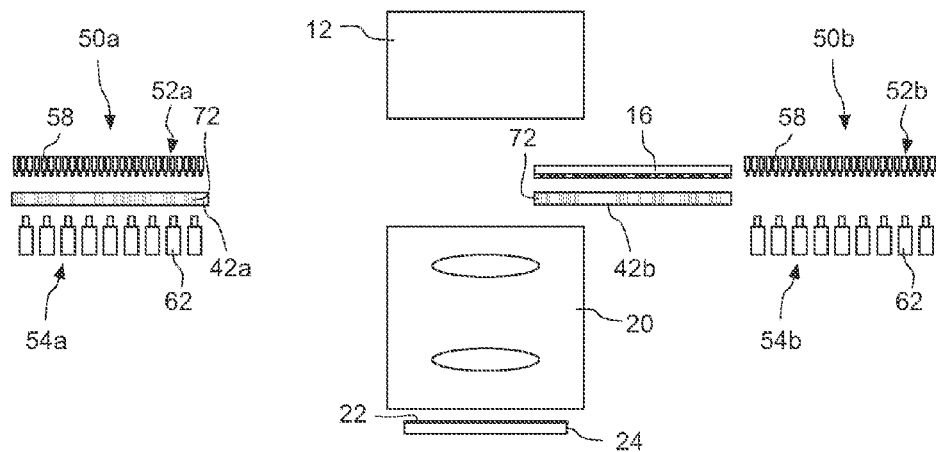
Fig. 3e
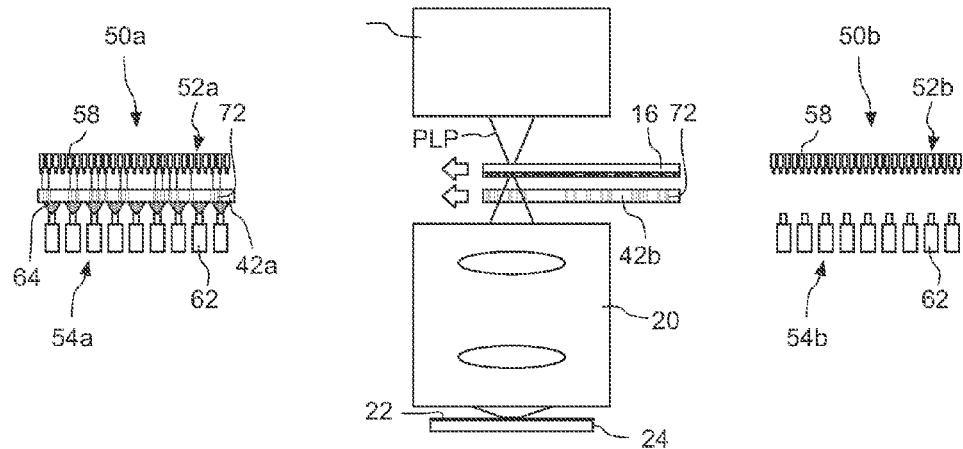
Fig. 3f
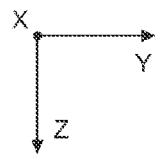

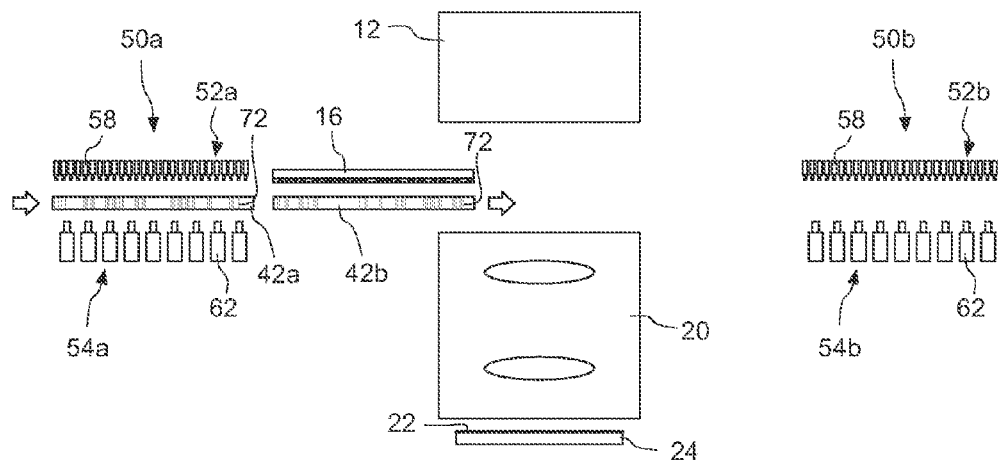
Fig. 3g
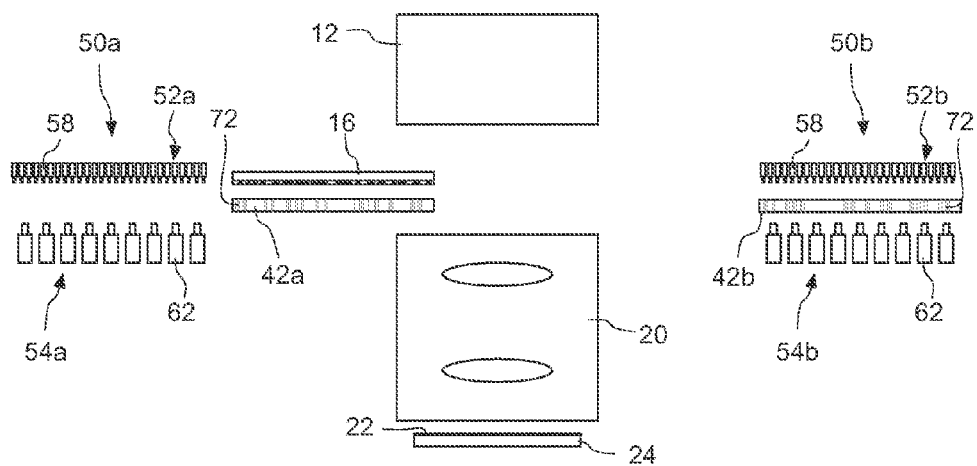
Fig. 3h
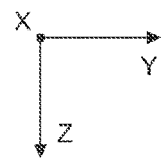

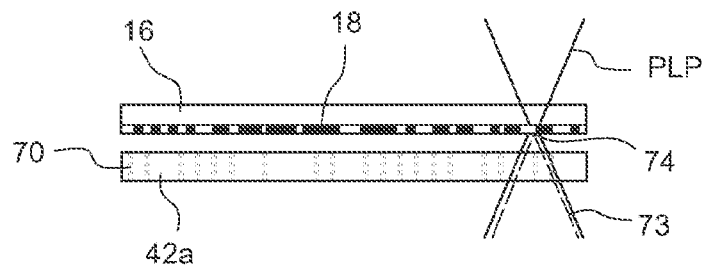
Fig. 4a
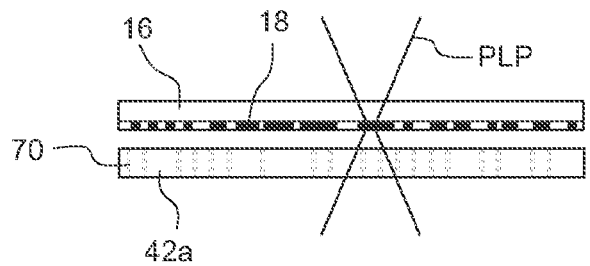
Fig. 4b
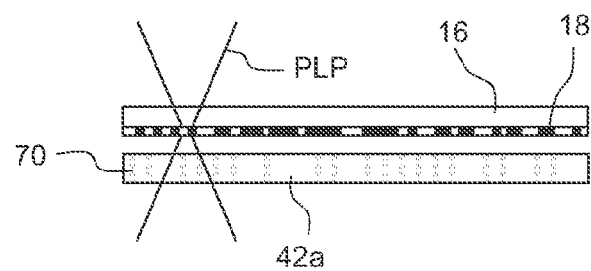
Fig. 4c
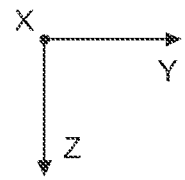

MICROLITHOGRAPHIC PROJECTION EXPOSURE APPARATUS AND METHOD OF CORRECTING OPTICAL WAVEFRONT DEFORMATIONS IN SUCH AN APPARATUS

CROSS-REFERENCE TO RELATED APPLICATION

The present application is a continuation of, and claims benefit under 35 USC 120 to, international application PCT/EP2013/002693, filed Sep. 9, 2013. The entire disclosure of international application PCT/EP2013/002693 is incorporated by reference herein.

FIELD

The disclosure generally relates to the field of microlithography, and in particular to projection exposure apparatus. The disclosure is particularly concerned with correcting optical wavefront deformations in such apparatus.

BACKGROUND

Microlithography (also called photolithography or simply lithography) is a technology for the fabrication of integrated circuits, liquid crystal displays and other microstructured devices. The process of microlithography, in conjunction with the process of etching, is used to pattern features in thin film stacks that have been formed on a substrate, for example a silicon wafer. At each layer of the fabrication, the wafer is first coated with a photoresist which is a material that is sensitive to radiation, such as ultraviolet light. Next, the wafer with the photoresist on top is exposed to projection light through a mask in a projection exposure apparatus. The mask contains a circuit pattern to be projected onto the photoresist. After exposure the photoresist is developed to produce an image corresponding to the circuit pattern contained in the mask. Then an etch process transfers the circuit pattern into the thin film stacks on the wafer. Finally, the photoresist is removed. Repetition of this process with different masks results in a multi-layered microstructured component.

A projection exposure apparatus typically includes an illumination system, a mask stage for aligning the mask, a projection objective (often simply referred to as "the lens") and a wafer stage for aligning the wafer coated with the photoresist. The illumination system illuminates a field on the mask that may have the shape of a rectangular slit or a narrow ring segment, for example.

In current projection exposure apparatus a distinction can be made between two different types of apparatus. In one type each target portion on the wafer is irradiated by exposing the entire mask pattern onto the target portion in one go; such an apparatus is commonly referred to as a wafer stepper. In the other type of apparatus, which is commonly referred to as a step-and-scan apparatus or simply scanner, each target portion is irradiated by progressively scanning the mask pattern under the projection light beam in a given reference direction while synchronously scanning the substrate parallel or anti-parallel to this direction. The ratio of the velocity of the wafer and the velocity of the mask is equal to the magnification $\beta$ of the projection lens, for which usually $|\beta|<1$ holds, for example $|\beta|=\frac{1}{4}$ or $|\beta|=\frac{1}{100}$.

An aim in the development of projection exposure apparatus is to be able to lithographically define structures with smaller and smaller dimensions on the wafer. Small structures lead to an increased output of the manufacturing process and also to a high integration density. This, in turn, has usually a favorable effect on the performance of the produced microstructured components.

The minimum size of the structures that can be lithographically defined is approximately proportional to the wavelength of the projection light. Therefore the manufacturers of such apparatus strive to use projection light having shorter and shorter wavelengths. The shortest wavelengths currently used are 365 nm, 248 nm, 193 nm and 13 nm and thus lie in the deep (DUV), vacuum (VUV) or extreme (EUV) ultraviolet spectral range, respectively.

The correction of aberrations is becoming increasingly important for projection objectives designed for operating wavelengths in the DUV and VUV spectral range. Different types of aberrations usually involve different correction measures.

The correction of field independent and rotationally symmetric aberrations is comparatively straightforward. A field independent aberration is referred to as being rotationally symmetric if the wavefront deformation in the exit pupil of the projection objective is rotationally symmetric. The term wavefront deformation refers to the deviation of a wavefront from an ideal aberration-free wavefront. Rotationally symmetric aberrations can be corrected, for example, at least partially by moving individual optical elements along the optical axis.

Correction of those aberrations which are not rotationally symmetric is more difficult. Such aberrations occur, for example, because lenses and other optical elements heat up rotationally asymmetrically. One aberration of this type is astigmatism.

In order to correct rotationally asymmetric aberrations, U.S. Pat. No. 6,338,823 B1 proposes a lens which can be selectively deformed with the aid of a plurality of actuators distributed along the circumference of the lens. The deformation of the lens is determined such that heat induced aberrations are at least partially corrected. A more complex type of such a wavefront correction device is disclosed in US 2010/0128367 A1.

US 2010/0201958 A1 and US 2009/0257032 A1 disclose a wavefront correction device that includes two glass plates that are separated from each other by a liquid. A corrective effect on the optical wavefront is not obtained by deforming the glass plates, but by changing their refractive index locally. To this end one of the two glass plates is provided with heating wires that extend over a surface through which projection light passes. With the help of the heating wires a temperature distribution inside the glass plate can be produced that causes, via the dependency dn/dT of the refractive index n on the temperature T, the desired distribution of the refractive index.

U.S. Pat. No. 6,504,597 B2 and WO 2013/044936 A1 propose correction devices in which heating light is coupled into a lens or a plate via its peripheral rim surface, i.e. circumferentially. Optical fibers may be used to direct the heating light produced by a single light source to the various locations distributed along the periphery of the optical element.

WO 2011/116792 A1 and EP 1 524 558 A1 disclose a wavefront correction device in which a plurality of fluid flows emerging from a corresponding number of fluid outlet apertures enter a space in the vicinity of a pupil plane through which projection light propagates during operation of the projection exposure apparatus. A temperature controller, which may include heat dissipating members that are arranged at the outside of channels walls, sets the temperature including individually for each fluid flow. The temperature distribution is determined such that optical path length differences caused by the temperature distribution correct wavefront errors. An advantage of this prior art wavefront correction devices is that it is able to correct also wavefront deformations which change very quickly, for example during a single scan cycle. However, it is difficult to produce a laminar fluid flow by combining the plurality of individual fluid flows.

SUMMARY

The disclosure seeks to provide a microlithographic projection exposure apparatus with a correction device which is capable of correcting quickly changing disturbances, and in particular quickly changing rotationally asymmetric wavefront deformations. Nevertheless the device desirably has a simple structure.

The disclosure provides a microlithographic projection exposure apparatus, including a mask stage configured to hold a mask, an illumination system that is configured to illuminate the mask with projection light, a substrate stage that is configured to hold a substrate supporting a light sensitive surface, and a projection objective that is configured to image at least a portion of the mask illuminated by the projection light on the light sensitive surface. The apparatus further includes a correction device that is configured to correct optical wavefront deformations and includes a first optical element, a second optical element and a drive mechanism that is configured to move the first and second optical elements between a first arrangement and a second arrangement. In the first arrangement the first optical element is an inner optical element having at least a portion that is arranged in a projection light path, and the second optical element is an outer optical element that is arranged completely outside the projection light path. In the second arrangement the second optical element is the inner optical element and the first optical element is the outer optical element. The correction device further includes a temperature control device that is configured to modify a temperature distribution in the outer optical element.

The disclosure is based on the perception that it is relatively easy to generate a desired temperature distribution in a solid optical element that is arranged outside the projection objective. If this optical element is transferred to a position in which it becomes an inner optical element being at least partially arranged in the projection light path, the temperature distribution in the inner optical element results in a local variations of the refractive index, and to some extent also of the shape, of the inner optical element. These local variations induce phase changes that can be used to correct the optical wavefront deformations. Many problems which arise from fluid flows passing through the projection light path, such as turbulences or impurities carried with the fluid flows, and which tend to compromise the corrective effect, cannot occur because the temperature distribution is generated in a solid body.

Since the temperature distribution in the inner optical element can only be maintained for a certain time, a desired temperature distribution, which may be the same or a different temperature distribution, is generated in the outer optical element while it is arranged completely outside the projection light path. Then the optical elements are exchanged so that the first and second optical elements change their roles as inner and outer optical elements. By exchanging two or more optical elements in this manner, it is possible to maintain an approximately constant temperature distribution in the respective inner optical element for hours or even days, if needed. On the other hand, if a temperature distribution is generated in the outer optical element that differs from the temperature distribution in the inner optical element, it is possible, by quickly exchanging the two optical elements, to change the corrective effect almost instantly.

If the inner optical element is arranged in a pupil plane of the projection objective, it is capable of correcting field-independent wavefront deformations very effectively.

However, the inner optical element having a desired temperature distribution is particularly suited to correct field-dependent wavefront deformations that change during a single scan cycle while the mask is displaced. This is because the inner optical element may, because it is a solid body, be displaced as well, and in particular parallel to and with the same velocity as the mask. Then it is possible to correct wavefront deformations that are associated with certain defects in the mask, the resist or the wafer, for example heat induced mask deformations, variations of the resist thickness or deformations of the wafer.

It is therefore preferred to arrange the inner optical element close to a field plane. Since there is usually no space available in the vicinity of the image plane, the inner optical element may be arranged in an intermediate image plane within the projection objective. This may involve, however, the provision of a gas lock that separates the atmosphere within the projection objective from the surrounding outside atmosphere.

The most suitable position for the inner optical element is therefore an axial position in the vicinity of the mask, and in particular between the mask and the projection objective. If the drive mechanism is configured such that the inner optical element is spaced apart by less than 50 mm from the mask along an optical axis of the projection objective, a good field-dependent effect is achieved.

In one embodiment the first and second optical elements are arranged on a common support. This support may, for example, be linearly displaced into opposite directions to convey the first and second optical elements between the first and second arrangements. A still simpler approach is to configure the drive mechanism such that the common support is rotated.

If the axis of rotation is sufficiently far away from the first and second optical elements, the rotational movement approximates a linear movement as it is usually performed by the mask. Then wavefront deformations can be corrected—at least to some extent—that are associated with the moving mask itself. Ideally the common support then rotates with a constant angular frequency.

For attaining a perfect synchronization of the inner optical element and the mask, the mask stage may be configured to displace the mask along a scan direction. The substrate stage is configured to displace the substrate synchronously with the mask, and the drive mechanism is configured to displace the inner optical element synchronously with the mask. With such a synchronization it is possible to correct also wavefront deformations that have a mask position dependency.

If the inner optical element is arranged in the vicinity of the mask, the drive mechanism should therefore be capable of displacing the inner optical element parallel to and with the same velocity as the mask. If the inner optical element is arranged in an intermediate image plane, the direction and the velocity may be different. Nevertheless the movements of the mask and the inner optical elements have to be synchronized so as to be able to correct also wavefront deformations having a mask position dependency.

A synchronization with equal velocities is particularly easy if the drive mechanism is capable of getting mechanically coupled to the mask stage while the mask is projected on the light sensitive surface. If the inner optical element shall be conveyed to the temperature control device, the mechanical coupling is disengaged. In this context it should be noted that the inner element does not have to be synchronized with the mask with the same accuracy as it is involved for the synchronization between the mask and the substrate.

The temperature control device may include a cooling unit that is configured to cool the outer optical element and a heating unit that is configured to heat up selected portions of the outer optical element so as to generate a variable temperature distribution therein. A cooling unit is advantageous because it can then be ensured that the mean temperature of the outer optical element is maintained at a constant value. If only heating units or only cooling units were provided, the mean temperature could increase or decrease each time a temperature distribution is generated. This may eventually create additional problems such as deformation of the optical elements or a heat transfer to adjacent optical elements via radiation.

In one embodiment the heating unit includes a radiation source, for example a plurality of laser diodes, LEDs or optical fibers guiding light produced in a central light radiation source, that directs heating radiation on the outer optical element. Such a radiation source makes it possible to heat up the outer optical element in a contactless manner. Furthermore, it is possible to generate almost any arbitrary temperature distribution using a radiation that is at least partially absorbed by the outer optical element. It is only involved that the optical elements are transparent for the projection light, but absorb a significant percentage of the heating radiation.

Preferably the first and second optical elements are plates made from an optical material that is transparent for the projection light and have plane and parallel refractive surfaces. This has the advantage that the optical effect does not change if the plate is displaced through the projection light path. If the inner optical element shall remain stationary during a scan cycle, however, it is also possible to use lenses or mirrors as optical elements.

In one embodiment the apparatus includes a sensor that is configured to output measurement signals and a control unit that is configured to produce control signals for the temperature control device depending on the measurement signals output by the sensor. Then it is possible to produce the desired corrective effect on the basis of measurements and not only on the basis of assumptions or simulations.

The sensor may be configured to measure a thickness of a resist forming the light sensitive surface at a plurality of points, or to measure the position of a plurality of points on the mask. Then important causes for field depending wavefront deformations can be directly measured and used to determine the desired corrective effect.

Subject of the disclosure is also a method of correcting optical wavefront deformations in a microlithographic projection exposure apparatus, including the following steps:
a) modifying a temperature distribution in a first optical element while it is arranged outside a projection light path of the apparatus;
b) moving the first optical element into the projection light path;
c) illuminating a mask with projection light and imaging the mask on an light sensitive surface;
d) during step c), modifying a temperature distribution in a second optical element while it is arranged outside the projection light path;
e) after step c), removing the first optical element from the projection light path and moving the second optical element into the projection light path;
f) repeating step c).

The first and the second optical elements may, while they are arranged in the projection light path, be spaced apart by less than 50 mm from the mask along an optical axis of a projection objective of the apparatus.

The first and second optical elements may be arranged on a common support that may be rotated during steps b) and e).

Preferably, however, the mask, a substrate supporting a light sensitive surface and the first optical element move synchronously during step c). If the first optical element is arranged in the vicinity of the mask, the first optical element preferably moves parallel to and with the same velocity as the mask during a scan cycle.

During steps a) and d) the first and second optical element, respectively, may be (simultaneously or successively) cooled by a cooling unit and heated by a heating unit so as to generate a variable temperature distribution in the first and second optical element, respectively, while maintaining a constant mean temperature.

In one embodiment the method includes the following additional steps:
g) during step f), repeating step a);
h) after step f), removing the second optical element from the projection light path;
i) repeating steps b) and c);
j) repeating steps d) to i) n times, with n being a positive integer.

Then the two optical elements repeatedly change their positions, and it is thus possible to maintain a certain temperature distribution in the projection light path with minimum changes over a time that is only limited by the number n.

If there are three optical elements, the method may include the steps of:
g) during step f), modifying a temperature distribution in a third optical element while it is arranged outside the projection light path;
h) after step f), removing the second optical element from the projection light path and moving the third optical element into the projection light path;
i) repeating step c);
j) repeating steps a) to i) n times, with n being a positive integer.

Subject of the disclosure is also a microlithographic projection exposure apparatus including a correction device that is configured to correct optical wavefront deformations and includes a first optical element, a second optical element and a drive mechanism that is configured to move the first and second optical elements between a first arrangement and a second arrangement. In the first arrangement the first optical element is an inner optical element having at least a portion that is arranged in a projection light path, and the second optical element is an outer optical element that is arranged completely outside the projection light path. In the second arrangement the second optical element is the inner optical element and the first optical element is the outer optical element. The correction device further includes a temperature control device that is configured to modify a temperature distribution in the outer optical element.

DEFINITIONS

The term "light" denotes any electromagnetic radiation, in particular visible light, UV, DUV and VUV light.

The term "light ray" is used herein to denote light whose path of propagation can be described by a line.

The term "light beam" is used herein to denote a plurality of light rays. A light beam usually has an irradiance profile across its diameter that may vary along the propagation path.

The term "surface" is used herein to denote any planar or curved surface in the three-dimensional space. The surface may be part of a body or may be completely separated therefrom.

The term "optically conjugate" is used herein to denote the imaging relationship between two points or two surfaces. Imaging relationship means that a light bundle emerging from a point converges at the optically conjugate point.

The term "field plane" is used herein to denote the mask plane or a plane that is optically conjugate to the mask plane.

The term "pupil plane" is used herein to denote a plane in which all light rays, which converge or diverge under the same angle in a field plane, pass through the same point. As usual in the art, the term "pupil plane" is also used if it is in fact not a plane in the mathematical sense, but is slightly curved so that, in a strict sense, it should be referred to as pupil surface.

BRIEF DESCRIPTION OF THE DRAWINGS

Various features and advantages of the present disclosure may be more readily understood with reference to the following detailed description taken in conjunction with the accompanying drawing in which:

FIG. 3a a still further simplified meridional section through the apparatus shown in FIGS. 1 and 2 at an initial operation condition;

FIGS. 3b to 3i meridional sections similar to FIG. 3a, but at later times during the operation of the apparatus;

FIGS. 4a to 4c enlarged cut-outs from FIG. 3c at three different times during a scan cycle;

DESCRIPTION OF PREFERRED EMBODIMENTS

I. First Embodiment

Figure 1:
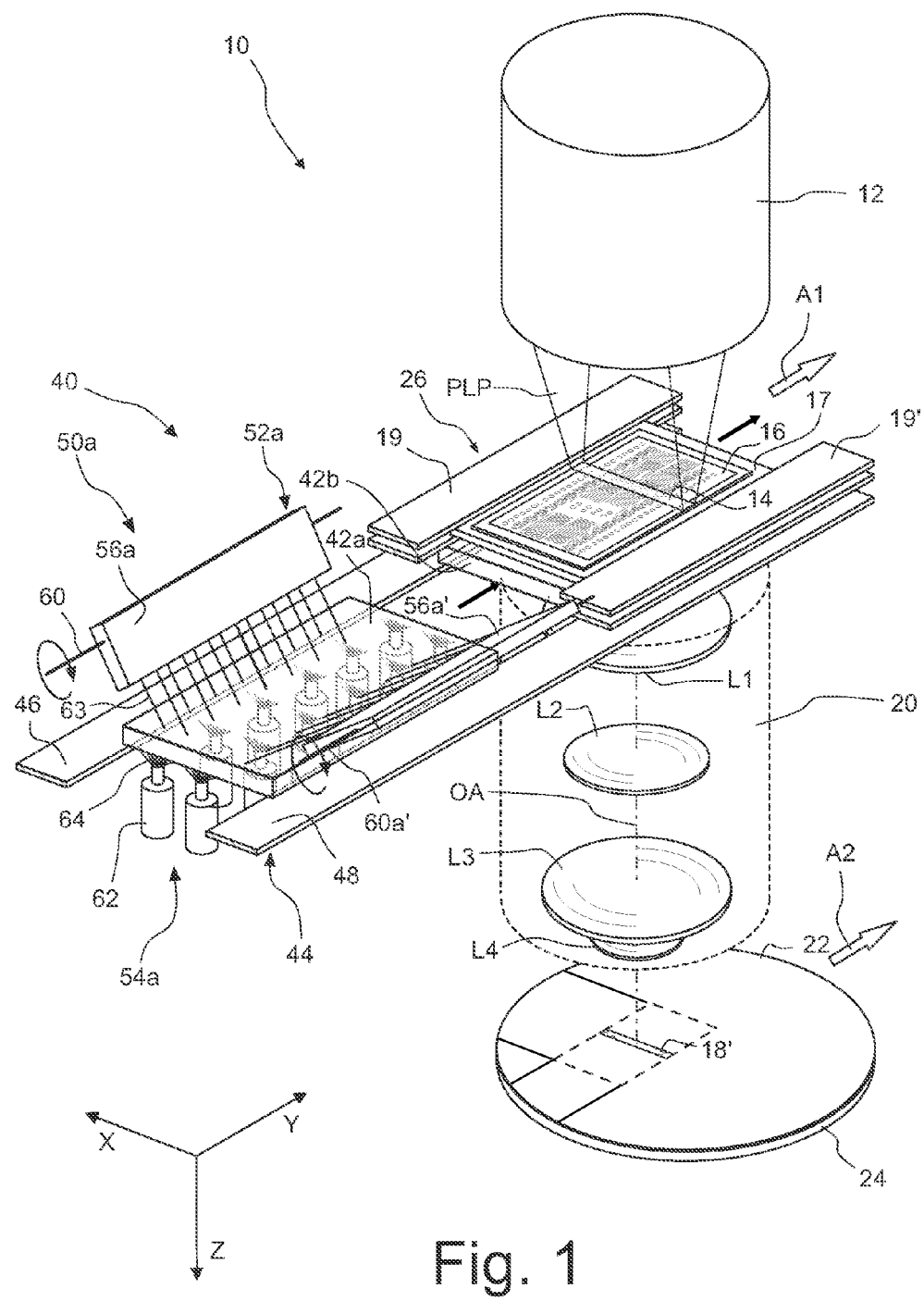
FIG. 1 is a perspective simplified view of a projection exposure apparatus in accordance with the present disclosure.

1. General Design of Projection Exposure Apparatus

The general design of a first embodiment of a projection exposure apparatus in accordance with the present disclosure will now be described with reference to FIGS. 1 and 2, which are a perspective view of and a meridional section through the apparatus, respectively. Both illustrations are highly schematic and not to scale.

The projection exposure apparatus, which is denoted in its entirety by 10, includes a light source LS that produces a beam of projection light having a center wavelength of about 193 nm and propagating through the apparatus along a projection light path PLP. The apparatus 10 further includes an illumination system 12 that homogenizes the projection light and directs it, with a predetermined angular and irradiance distribution, on a field 16 on a moving mask 16 containing a pattern 18 of minute structures. In this embodiment the illuminated field 14 has the shape of a rectangle. However, other shapes of the illuminated field 14, for example ring segments, and other wavelengths of the projection light, for example 248 nm or 157 nm, are contemplated as well. The mask 16 is mounted on a mask stage carrier 17 which is supported by a mask stage 26 including guide rails 19, 19'.

A projection objective 20 containing a plurality of lenses L1 to L4 and having an optical axis OA images the portion of the pattern 18 within the illuminated field 14 on resist 22 that forms a light sensitive surface and is supported by a substrate 24. The substrate 24, which may be formed by a silicon wafer, is arranged on a wafer stage 32 (shown only in FIG. 2) such that a top surface of the resist 22 is precisely located in an image plane 30 of the projection objective 20. The mask 16 is positioned by means of the mask stage 26 in an object plane 28 of the projection objective 20. Since the latter has a magnification β with |β|<1, a minified image 18' of the illuminated portion of the pattern 18 is projected onto the resist 22.

Figure 2:
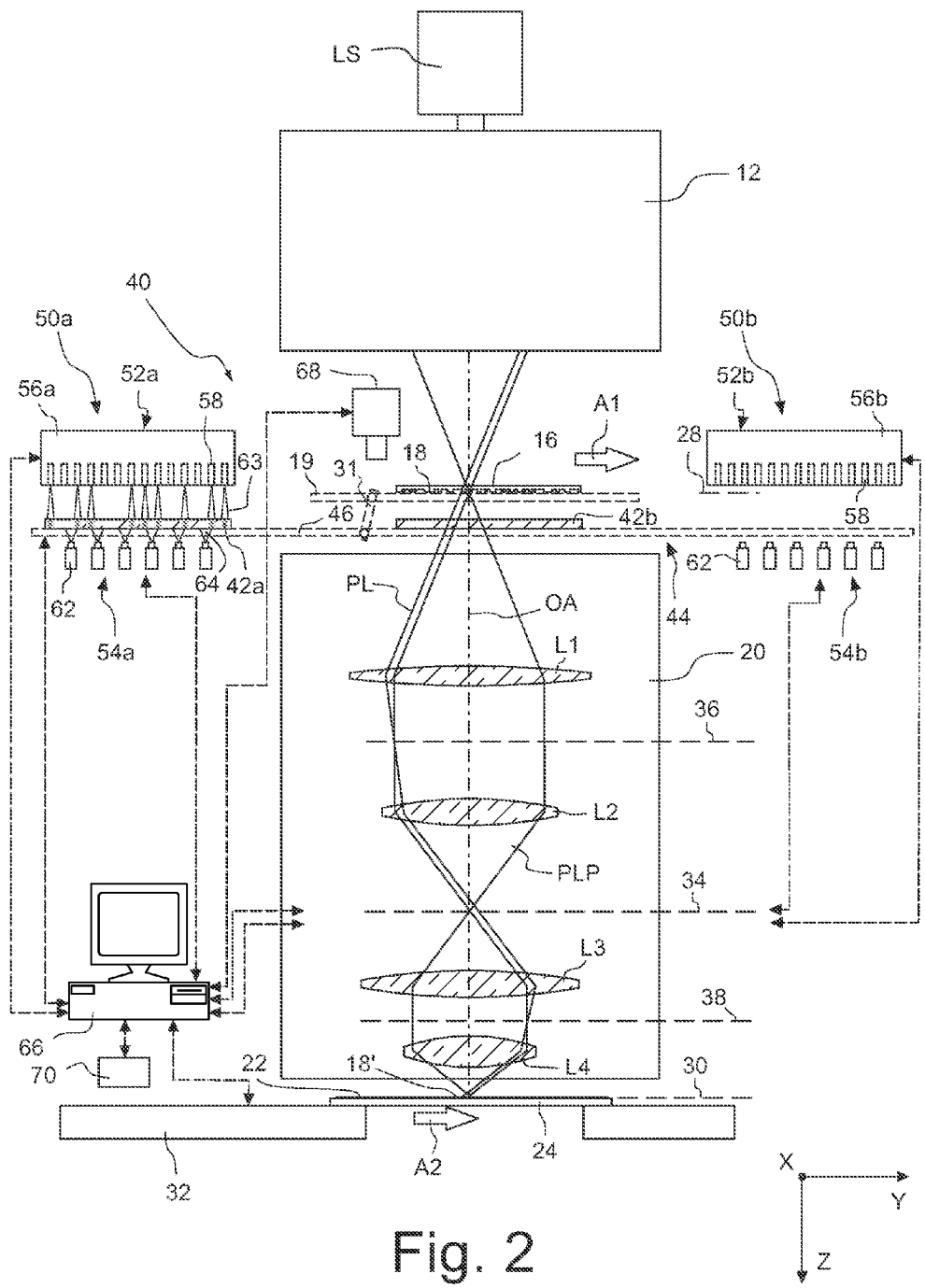
FIG. 2 is a meridional section through the apparatus shown in FIG. 1.

During the projection, the mask 16 and the substrate 24 move parallel to a scan direction which coincides with the Y direction, as this is indicated in FIGS. 1 and 2 by arrows A1 and A2. The illuminated field 14 then scans over the mask 16 so that structured areas larger than the illuminated field 14 can be continuously projected. Such a type of projection exposure apparatus is often referred to as "step-and-scan tool" or simply a "scanner". The ratio between the velocities of the substrate 24 and the mask 16 is equal to the magnification β of the projection objective 20. If the projection objective 20 inverts the image (β<0), the mask 16 and the substrate 24 move in opposite directions.

In the embodiment shown, the illuminated field 14 is centered with respect to the optical axis OA of the projection objective 20. This is usually the case in dioptric projection objectives, i.e. objectives containing only refractive optical elements, but no mirrors. Examples for this type of projection objectives can be found in WO 2003/075096 A2. In other embodiments, the illuminated field 14 is not centered with respect to the optical axis OA. An off-axis object and image field may be used with certain types of catadioptric projection objectives 20, i.e. objectives that contain refractive as well as reflective optical elements. Examples for catadioptric projection objectives having off-axis object and image fields are described in U.S. Pat. No. 6,665,126 B2 and WO 2005/069055 A2. In fact, the present disclosure can be advantageously used with any type of projection objective.

As can be seen in the meridional section of FIG. 2, the projection objective 20 has an intermediate image plane 34 in which a real image of the portion of the pattern 18 lying within the illuminated field 14 is formed. A first pupil plane 36 is located between the object plane 28 and the intermediate image plane 34, and a second pupil plane 38 is located between the intermediate image plane 34 and the image plane 30 of the projection objective 20. As this is illustrated in FIG. 2, all light rays converging or diverging under the same angle from any of the field planes, i.e. the object plane 28, the intermediate image plane 34 and the image plane 30, pass through the same point in the first and second pupil plane 36, 38, respectively.

2. Wavefront Correction Device

The apparatus 10 includes a wavefront correction device 40 for correcting, or more generally for modifying, aberrations.

a) Types of Aberrations

Aberrations are often quantitatively described by comparing real wavefronts to ideal wavefronts. The deviation of a real wavefront from the ideal wavefront is usually referred to as wavefront deformation and may be described by a complete set of normalized orthogonal functions such as Zernike polynomials. If the wavefront deformations are identical for all points in the image field, this is referred to as a field-independent aberration. If the wavefront deformations are substantially different for at least two points in the image field, the aberration is referred to as being field-dependent.

Field-independent wavefront deformations are usually corrected with correction devices arranged in or in close proximity to a pupil plane, because there all optical wavefronts completely overlap, and thus the effect of the correction device is equal for all image points. Field-dependent aberrations are usually more difficult to correct. The correction device has to be arranged in a field plane or in an intermediate position between a field plane and a pupil plane, and it has to be capable of producing at different locations a different corrective effect on the optical wavefront.

Aberrations can also be distinguished with respect to the time scale on which they occur. Some aberrations do not change over time, because they are caused by manufacturing tolerances or design imperfections that remain constant over time. Other aberrations change on a long time scale, for example many days of even years. For example, certain lenses may suffer from material degradations that are caused by the continuous exposure to the high-energy projection light. Still further aberrations change rapidly, for example within a few minutes or even seconds, during the operation of the apparatus 10. Causes for such rapidly changing aberrations include variable ambient conditions such as air pressure or temperature, and deformations and refractive index changes induced by temperature changes that occur as a result of the absorption of projection light within lens materials.

Rapidly changing field-dependent aberrations are particularly difficult to correct, because it involves producing a quickly changing corrective effect at different locations. Such aberrations may be caused, among others, by a deformation of the mask 16 due to changes of its temperature distribution, or by thickness variations of the photoresist that is used as the resist 22.

From the following description of the correction device 40 it will become apparent why it is particularly suited to correct such rapidly changing time dependent aberrations. The term "correct" is to be broadly construed in this context. The term denotes any modification of the optical wavefront that either directly reduces the largest Zernike coefficient (or alternatively the root means square (rms) over all Zernike coefficients that quantitatively describe the wavefront deformation), or that indirectly modifies the wavefront deformation such that it can be corrected more easily with other correction devices, for example manipulators that displace lenses L1 to L4 along or perpendicular to the optical axis OA.

b) General Design of Correction Device

The wavefront correction device 40 as shown in FIGS. 1 and 2 includes a first plate 42a and a second plate 42b that are made of a material that is transparent for the projection light. A suitable material for the first and second plates 42a, 42b is fused silica, for example. The plates 42a, 42b are supported by a drive mechanism 44 that is configured to move the plates 42a, 42b along the scan direction Y. In FIGS. 1 and 2 the drive mechanism 44 is schematically represented by two guide rails 46, 48 that extend parallel to the Y direction on both sides of the projection light path PLP and between the mask stage 26 and the projection objective 20. Since, at a given time, one of the plates 42a, 42b is moved parallel to and with the same velocity as the mask 16 through the projection light path PLP, the drive mechanism can be mechanically coupled to the mask stage 26, as this is indicated in FIG. 2 be a lever 31.

At one end of the drive mechanism 44 a first temperature control device 50a is arranged that includes a heating unit 52a and a cooling unit 54a. In this embodiment the heating unit 52a is arranged above the plane in which the plates 42a, 42b can be displaced, and it includes two LED bars 56a, 56a' each containing a plurality of light emitting diodes (LEDs) 58 that are indicated in FIG. 2 with dashed lines. The two LED bars 56a, 56a' can be rotated around axes 60a, 60a' with the help of drives (not shown). By rotating the LED bars 56a, 56a' around the axes 60a, 60a' and simultaneously displacing the second plate 42b along the Y direction with the help of the drive mechanism 44, it is possible to direct light bundles 63 emitted by the LEDs 58 to any arbitrary point on the second plate 42b.

The LED are configured to produce heating light having a center wavelength that is strongly absorbed by the plates 42a, 42b. In this embodiment shown the central wavelength is within the IR absorption window of fused silica.

The cooling unit 54a is arranged opposite the heating unit 52a and below the plane in which the plates 42a, 42b can be displaced. The cooling unit 54a includes, in the embodiment shown, a plurality of gas nozzles 62 each emitting a gas jet 64 that is directed to the bottom surface of the second plate 42b if the latter is arranged in the first temperature control device 50a.

As can only be seen in the meridional section of FIG. 2, a second temperature control device 50b is arranged at the opposite end of the guide rails 46, 48. The second temperature control device 50b has the same constitution as the first temperature control device 50a. In FIG. 2 one of the two LED bars 56b with LEDs 58 and some gas nozzles 62 of the cooling unit 54b are shown.

As shown in FIG. 2, the apparatus 10 further includes a central control unit 66 that controls the operation of the LEDs 58 in the heating unit 52*a*, 52*b* and the gas nozzles 42 in the cooling units 54*a*, 54*b* individually. The central control unit 66 is furthermore connected to a mask shape sensor 68 that is configured to measure the shape of the mask 16. To this end the mask shape sensor 68 may be configured to measure the coordinates of a plurality of points on the mask in a contactless manner. Since such mask shape sensors 68 are known in the art as such, the sensor 68 will not be explained here in further detail.

The apparatus 10 further includes a resist thickness sensor 70 that is configured to measure the thickness of the resist 22 applied on the substrate 24 before the resist is exposed. The resist thickness sensor 70 is also connected to the central control unit 66. Since such thickness sensors 70 are known in the art as such, also the sensor 70 will not be explained here in further detail.

In the configuration shown in FIGS. 1 and 2 the first plate 42*a* is arranged in the first temperature control device 50*a* and thus outside the projection light path PLP. The plate 42*a* or 42*b* that is, at a given instance, arranged completely outside the projection light path PLP will be referred to in the following also as the outer plate. The plate 42*a* or 42*b* having at least a portion that is, at a given instance, arranged in the projection light path PLP will be referred to in the following also as the inner plate. As it will become apparent from the following description of the function of the correction device 40, the first plate 42*a* may at some times be an outer plate and at some times be an inner plate. The same also applies for the second plate 42*b*.

b) Function

In the following the function of the wavefront correction device 40 will be explained with reference to FIGS. 3*a* to 3*i* that show the apparatus 10 at different times of the operation in a meridional section similar to FIG. 2, but in a more schematic and simplified manner.

FIG. 3*a* illustrates the apparatus 10 in an initial condition in which the mask 16 is in a waiting position outside the projection light path and the illumination system 12 does not yet direct projection light on the mask 16. It is assumed that the mask shape sensor 68 has already obtained measurement data relating to the shape of the mask 16 and has transmitted these measurement data to the central control unit 66. The latter has also received measurement data from the resist thickness sensor 70 that has measured the thickness of the resist 22 applied on the substrate 24 at a plurality of positions.

It will further be assumed that the mask shape sensor 68 has detected that the mask 16 is not perfectly flat, but slightly bended, for example as a result of the gravitational force acting on the mask 16. It is also assumed that the resist thickness sensor 70 has detected that the thickness of the resist 22 is not perfectly uniform, but slightly varies over the surface of the substrate 24.

If the mask 16 was now imaged on the resist 22, at least certain areas on the mask 16 would not be arranged perfectly in the object plane of the projection objective 20 due to its bended shape. Similarly, certain areas of the surface of the resist 22 may not be arranged exactly in the image plane 30 of the projection objective 20 because of the resist thickness variations. Both effects (particularly if combined) result in a blurred image of the structures 18, which are contained in the mask 16, on the resist 22. Particularly if the projection objective 20 is not perfectly telecentric on the object side and the image side, deformations of the mask 16 and thickness variations of the resist 22 may also result in distortion, i.e. a lateral displacement of the image points with respect to the ideal position. The correction device 40 is capable of correcting such aberrations very efficiently by arranging one of the plates 42*a*, 42*b* in the projection light path and in immediate vicinity to the mask 16, wherein the plate 42*a*, 42*b* has a temperature distribution—and thus a refractive index distribution—that modifies the optical wavefronts such that the aberrations are at least partially corrected.

To this end the control unit 66 computes, based on the measurement data obtained by the mask shape sensor 68 and the resist thickness sensor 70, how the optical wavefronts have to be modified to obtain a sufficient corrective effect. Since the refractive index n of the plates 42*a*, 42*b* depends on the temperature T (i.e. $dn/dT \neq 0$), a variation of the temperature in the plates 42*a*, 42*b* results in a phase variation of optical wavefronts passing through the plates 42, 42*b*. As an additional effect the plates 42*a*, 42*b* may locally deform as a result of temperature changes, and this affects the phase of the optical wavefronts, too. In fused silica and other suitable materials for the plates 42*a*, 42*b* the refractive index changes have a much stronger effect on the phase than the deformations so that the latter may be disregarded by the central control unit 66.

The temperature distribution to correct the expected aberrations is produced in the first plate 42*a* while it is the outer plate that is arranged in the first temperature control device 50*a*. To this end the LEDs 58 are individually controlled by the central control unit 66 so that the heating light produced by the LEDs heats up selected portions 72 in the first plate 42*a*, as this is shown in FIG. 3*a*. The generation of a temperature distribution in the first plate 42*a* may take a few seconds or minutes depending, among others, on the intensity of the heating light emitted by the LEDs 58 and the coefficient of absorption of the plates 42*a*, 42*b* for the heating light. After the desired temperature distribution has been generated in the first plate 42*a* (this may be monitored by a heat camera, not shown), the drive mechanism 44 removes the first plate 42*a* from the first temperature control device 50*a* and displaces it to an initial operating position that is shown in FIG. 3*b*. In this initial operating position the first plate 42*a* having the desired temperature distribution is arranged directly below the mask 16, but still outside the projection light path.

During the steps shown in FIGS. 3*a* and 3*b* the second plate 42*b* is also an outer plate because it is still arranged in the second temperature control device 50*b* that does not yet operate.

In a next step shown in FIG. 3*c* the projection of the mask 16 on the resist 22 commences. The illuminated field 14 scans over the mask 16 while the latter is displaced along the Y direction. The drive mechanism 44 displaces the first plate 42*a* parallel to and with the same velocity as the mask 16. Thus also the temperature distribution generated in the first plate 42*a* moves synchronously with the mask 16. The first plate 42*a* is now the inner plate.

This is also illustrated in FIG. 4*a* which is an enlarged cut-out from FIG. 3*c* showing only the mask 16 with the structures 18, the first plate 42*a* and the projection light path PLP. Here it is assumed that a light bundle 73 emerges from a point 74 on the mask 16 that would not be accurately imaged on the resist 22 because the mask 16 is deformed and/or the top surface of the resist 22 is not arranged exactly in the image plane 30 of the projection objective 20. When this light bundle 73 passes through a heated portion 72 in the first plate 42*a*, it will experience a higher refractive index because $dn/dT>0$ in fused silica. This corresponds to a larger optical path length and may compensate the effect that the thickness of the resist 22 is smaller than a target value so that the image distance is increased.

As a matter of course, this representation of heated up portions 72 and cooler surrounding portions is only schematic. In fact the temperature distribution is a continuous three dimensional function inside the first plate 42, and the temperature distribution may be much more complex than shown in FIG. 4a, but may also be much simpler. For example, if the thickness variations of the resist 22 are negligible and the mask is slightly curved in only one direction, the temperature distribution may simply correspond to the profile of the mask.

FIGS. 4b and 4c illustrate how the mask 16 and the first plate 42a pass through the projection light path PLP during the scan operation. From these figures it becomes clear that throughout the scanning operation there is always a 1:1 correspondence between points 74 on the mask and an associated portion in the first plate 42a having a certain temperature.

Referring now to FIG. 3c again, it can be seen that while the mask 16 is projected on the resist 22, the LEDs 58 of the second temperature control device 50b generate a temperature distribution in the second plate 42b. If the desired corrective effect shall not change, this temperature distribution may be the same distribution that has been generated before in the first plate 42a. Then a replacement of the first plate 42a by the second plate 42b is performed only because the temperature distribution generated in the first plate 42a blurs after some time, for example about 10 seconds, to such an extent that the desired corrective effect can no longer be achieved.

In the embodiment shown it is assumed that the desired corrective effect changes because it turned out, after the shape of the mask 16 has been measured again by the mask shape sensor 68, that the shape of the mask 16 has changed due to an increase of its temperature caused by a partial absorption of projection light.

In a next step shown in FIG. 3d the illumination system 12 ceases to direct projection light on the mask 16. The first plate 42a moves back into the first temperature control device 50a, and also the mask 16 is retracted from the projection light path.

In a next step shown in FIG. 3e the second plate 42b having a modified temperature distribution is removed from the second control device 50b and displaced exactly below to its initial operating position below the mask 16.

As it is shown in FIG. 3f, the mask 16 is now projected again on the resist 22, but now the second plate 42b is the inner plate. Similarly as explained with reference to FIG. 3c and FIGS. 4a to 4c, the second plate 42b moves parallel to and with the same velocity as the mask 16 through the projection light path PLP.

While the second plate 42b passes repeatedly through the projection light path PLP, another temperature distribution is generated in the first plate 42a with the help of the first temperature control device 50a. To this end the LEDs 58 are again selectively controlled by the central control unit 66. In contrast to the previous steps the gas nozzles 62 now direct cool gas jets 64 on the bottom surface of the first plate 42a. This cooling is involved because otherwise the mean temperature of the first plate 42 would increase each time the LEDs 58 direct heating light on the first plate 42a. The gas nozzles 62 of the cooling unit 54a thus ensure that the mean temperature of the first plate 42a is kept constant at a predetermined target value.

In the embodiment shown all gas nozzles 62 direct gas jets 64 on the bottom surface of the first plate 42a to achieve a uniform overall cooling effect. However, it is also possible to selectively cool certain portions of the first plate 42a by controlling the gas nozzles 62 individually. As a matter of course, it is also possible to reverse this temperature control scheme, i.e. to heat up the first plate uniformly and cool only selective portions thereof.

In a next step shown in FIG. 3g the illumination system 12 again ceases to illuminate the mask 16. The second plate 42b is now removed from the projection light path and conveyed by the drive mechanism 44 into the second temperature control device 50b, while the mask 16 remains outside the projection light path. Now both plates 42a, 42b are outer plates again for a brief moment.

Figure 3I:
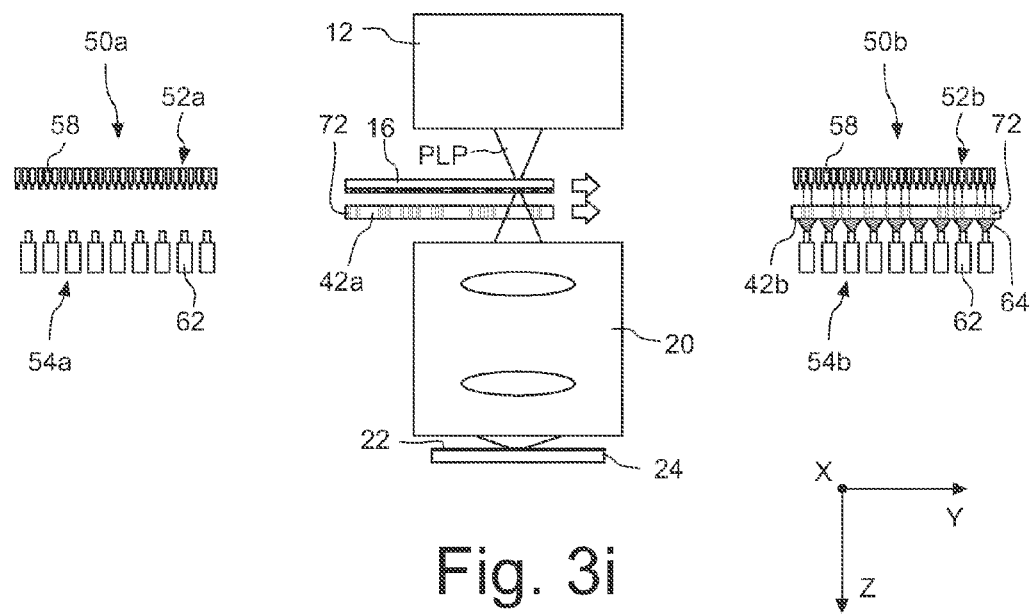

In a next step 3h the first plate 42a having the desired temperature distribution is removed from the first temperature control device 50a and conveyed to its initial operation position immediately below the mask 16. Then the projection operation is resumed again, as this is shown in FIG. 3i. While the first plate 42a passes repeatedly through the projection light path PLP, the same or another temperature distribution is generated in the second plate 42b with the help of the second temperature control device 50b. Now also the gas nozzles 62 direct cool gas jets 64 towards the bottom surface of the second plate 42b in order to ensure that the mean temperature remains at a predetermined value.

From the foregoing it became clear that the projection operation has to be interrupted only for the brief intervals during which the first and second plates 42a, 42b change positions.

Often it will suffice to generate the same temperature distribution alternately in the two plates 42a, 42b. If the corrective need changes, for example due to a heat induced deformation of the mask 16, this can be easily accomplished by modifying the temperature distribution that is transferred to the outer plate.

Since the mean temperature of the plates 42a, 42b is kept constant, and preferably at a value that is identical to the temperature of a surrounding gas, the temperature distribution can be maintained for quite a long time in the plates 42a, 42b. This time may be in the range of a few minutes which suffices to perform some dozens or even hundreds of scan cycles. How long the plate 42a, 42b can be inner plates before the temperature distribution should be "refreshed" depends, among others, on the temperature gradients generated in the plates 42a, 42b and the absolute temperature differences.

II. Other Embodiments

1. Turntable

Figure 6:
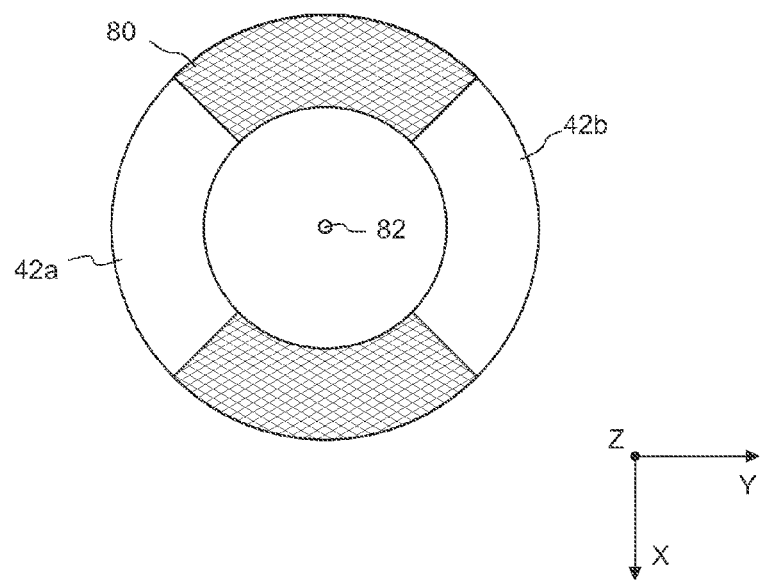
FIG. 6 a top view on the turntable shown in FIGS. 5a and 5b.
Figure 5A:
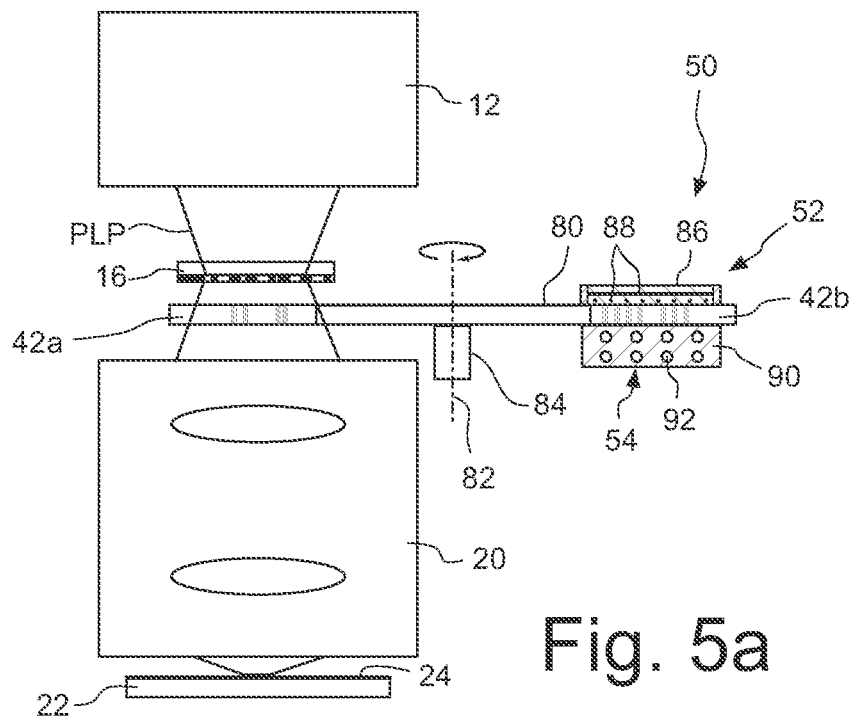
FIGS. 5a and 5b meridional sections through an apparatus according to an alternative embodiment in which plates are integrated in a turntable.
Figure 5B:
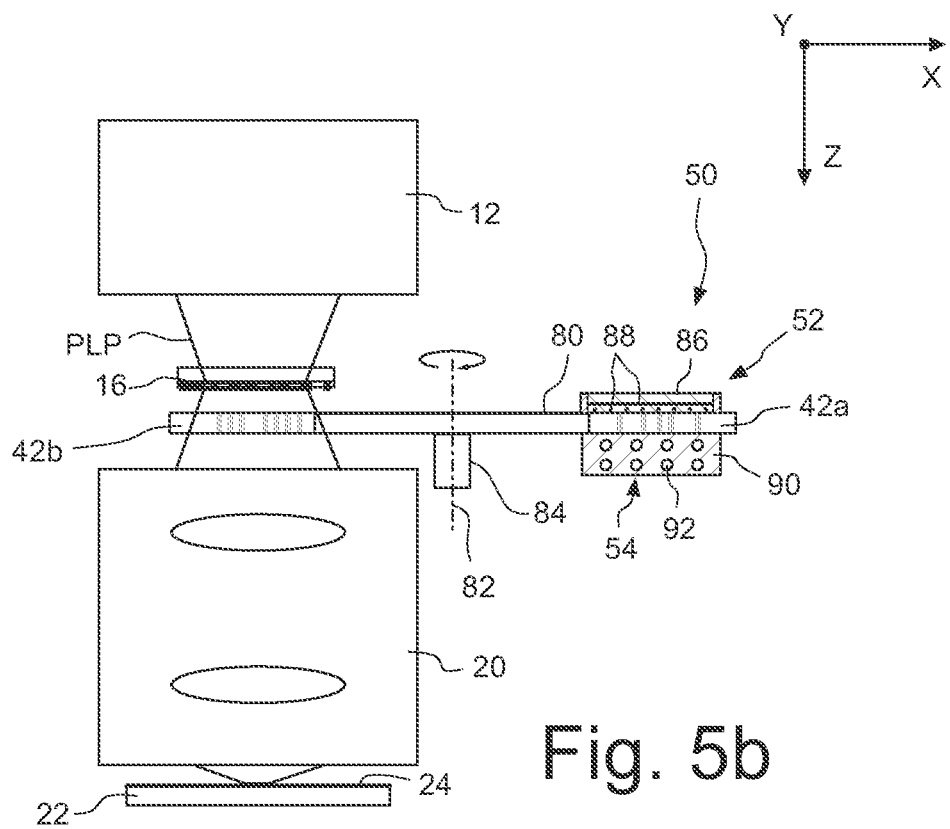

FIG. 5a illustrates in a schematic meridional section in the XZ plane (i.e. perpendicular to the scan direction Y) an apparatus 10 according to an alternative embodiment. In this embodiment the plates 42a, 42b are integrated in a turntable 80 that can be rotated around a rotational axis 82 with the help of a drive 84. As can best be seen in the top view of FIG. 6, the plates 42a, 42b have now the shape of ring segments that are arranged with a two-fold symmetry with respect to the rotational axis 82.

The correction device 40 includes only one temperature control device 50 with a heating unit 52 and a cooling unit 54. In this embodiment the heating unit 52 includes a first solid body 86 with integrated thin heating wires 88 extending in orthogonal directions. By suitably controlling the heating wires 88 it is possible to generate almost any arbitrary temperature distribution in the first solid body 86.

More details with regard to the heating unit 52 can be gleaned from US 2009/0257032 A1 which describes a wavefront correction device having a very similar constitution.

The cooling unit 54 includes a second solid body 90 containing a plurality of channels 92 through which a cooling liquid circulates during operation of the cooling unit 54.

The solid bodies 86, 90 that contact the plates 42a, 42b are made of material that is much softer than the plates 42a, 42b. This helps to prevent that the surface of the plate is damaged by scratches, and it also improves the heat transfer between the units 86, 90 and the plates 42a, 42b.

If the temperature distribution in the first plate 42a has blurred or a different temperature distribution is involved, the drive 84 turns the turntable 80 by 180° so that the second plate 42b becomes the inner plate and the first plate 42a becomes the outer plate that is arranged inside the temperature control device 50. In this embodiment the inner plate does not move while the projection light scans over the mask 16. It is therefore only possible to correct time variable and field-dependent wavefront deformations that do not depend on the mask or resist position.

Figure 7A:
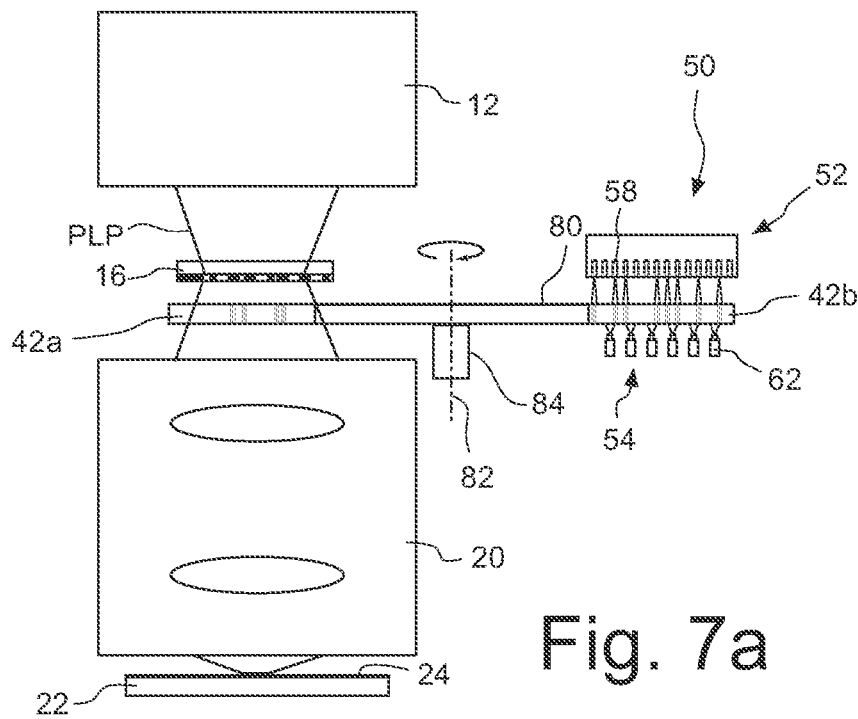
FIGS. 7a and 7b meridional sections through an apparatus according to a still further embodiment in which plates are integrated in a turntable that rotates during a projection of the mask.
Figure 7B:
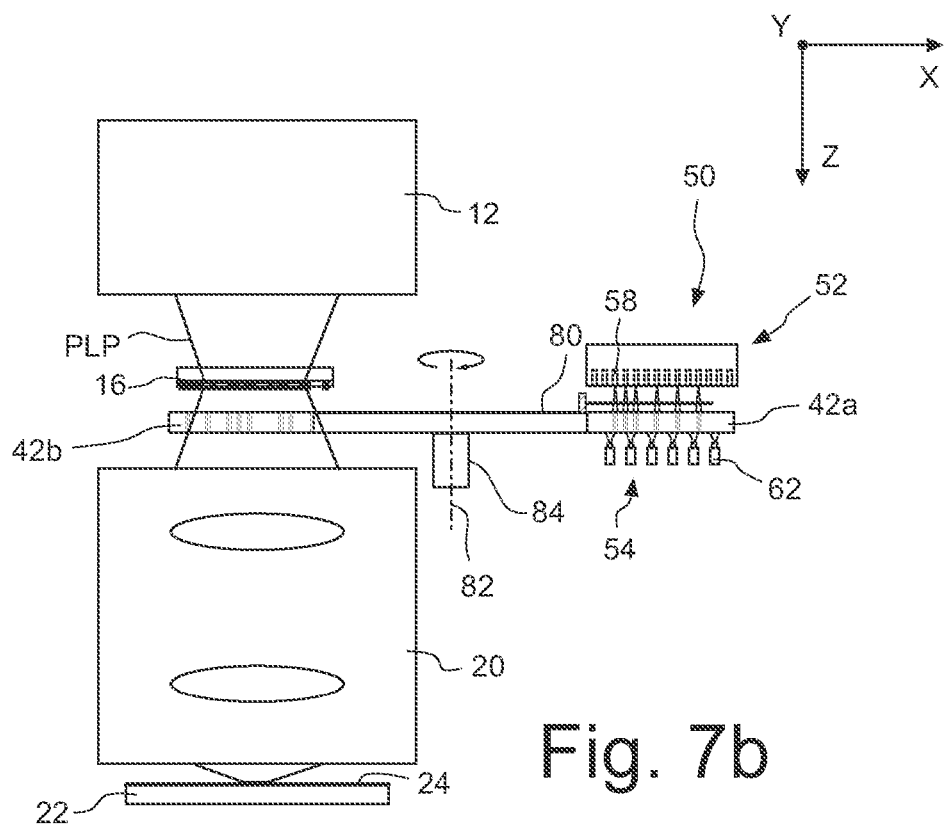

FIGS. 7a and 7b illustrate an alternative embodiment in which the temperature control device 50 includes a heating unit 52 and a cooling unit 54 that have substantially the same overall construction as the heating unit 52a and cooling unit 54a of the embodiment shown in FIGS. 1 and 2. In his embodiment, however, the turntable 80 rotates with a constant angular frequency, i.e. also during the projection of the mask. The inner plate arranged in the projection light path PLP therefore moves almost synchronously with the mask 16 along the Y direction which is perpendicular to the plane of the sheet of paper. The larger the diameter of the turntable 80 is, the more approximates the circular path of the inner plate the linear movement of the mask 16.

Figure 8:
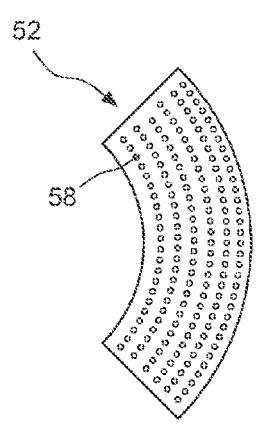
FIG. 8 a top view on a heating unit including a plurality of LEDs of the apparatus shown in FIGS. 7a and 7b.

While the inner plate moves through the projection light path PLP, the outer plate moves through the temperature control device 50. In order to generate a desired temperature distribution in the outer plate, the irradiance distribution generated by the LEDs 58 may rotate synchronously with the outer plate around the rotational axis 82. To this end the LEDs 58 may be arranged on concentric circles around the rotational axis 82, as this is schematically illustrated in FIG. 8 which is a bottom view on the heating unit 52 in which the LEDs 58 are represented by small circles. Thus it is possible to generate the desired temperature distribution in the outer plate although the latter rotates.

2. More than Two Plates

Figure 9:
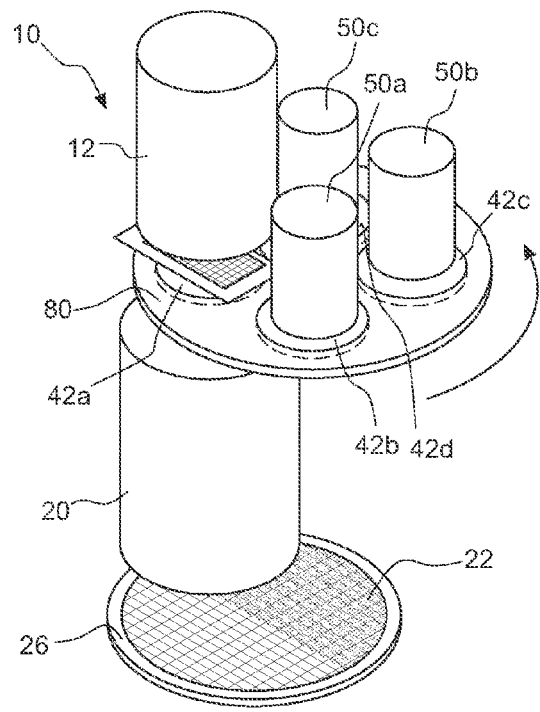
FIG. 9 a perspective view on an apparatus according to an embodiment which includes four plates integrated in a turntable.

If the turntable 80 includes four plates 42a to 42d and three temperature control devices 50a, 50b and 50c, as this is shown in the perspective view of an apparatus 10 shown in FIG. 9, three different temperature distributions may be generated simultaneously in the outer plates. Then a selection of an outer plate that shall become the next inner plate can be made depending on the most recent measurements or simulations from which the desired corrective effect is deduced. Instead of selectively generating a desired temperature distribution in an out plate, which is time consuming, the outer plate having the most suitable temperature distribution is, so to say, taken off the shelf. If a quick reaction time is more important than a perfect correction, the embodiment shown in FIG. 9 is therefore particularly advantageous.

Figure 10:
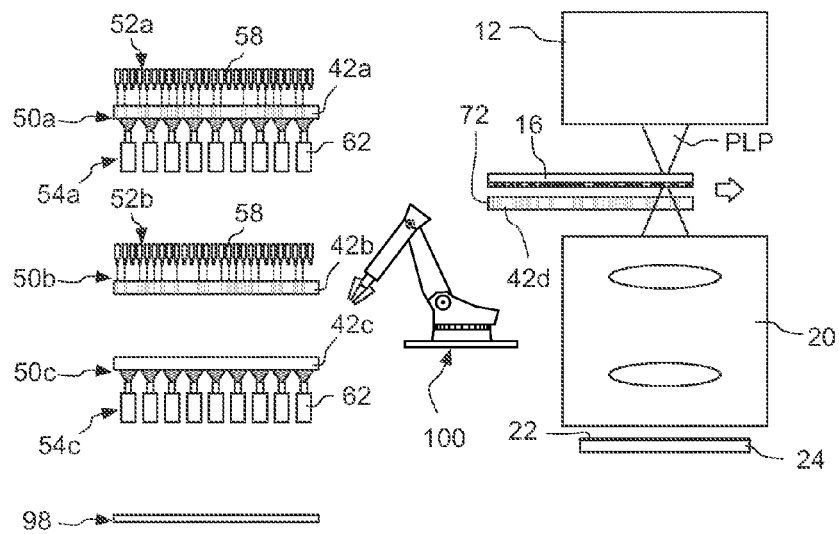
FIG. 10 a schematic meridional section through an apparatus in which the plates are conveyed by a handling robot.

Also the embodiment shown in FIG. 10 uses the concept of storing a plurality of plates having different temperature distributions. In this embodiment the correction device 40 includes a first temperature control device 50a including a heating unit 52a and a cooling unit 54a, a second temperature control device 50b including only a heating unit 52b, a third temperature control device 50c including only a cooling unit 54c, and a parking position indicated at 98.

A handling robot 100 conveys four plates 42a, 42b, 42c and 42d between the three temperature control devices 50a to 50c, the parking position 98 and the projection position in which at least a portion of the respective plate is arranged in the projection light path PLP. The correction device 40 may be controlled in such a manner that an inner plate is, after it has been arranged in the projection light path PLP for some time, first conveyed to the cooling unit 54c of the third temperature control device 50c with the help of the handling robot 100. After a while the plate is transferred to the parking position where the temperature distribution is allowed to homogenize further. Then the plate is transferred to the first temperature control device 50a in which a desired temperature distribution is generated. When this is accomplished, the plate is transferred by the handling robot 100 to the second temperature control device 50b in which the temperature distribution is maintained by illuminating the heating light that compensates heat losses resulting from radiation and heat transfer to a surrounding support structure (not shown).

In this manner it is possible to store, at any given time, two plates having different temperature distributions. If the desired corrective effect changes, the handling robot 100 may transfer from the two plates arranged in the temperature control devices 50a and 50b the plate to the operating position in the projection light path PLP that most closely matches to the temperature distribution to produce the desired corrective effect.

III. Method

Figure 11:
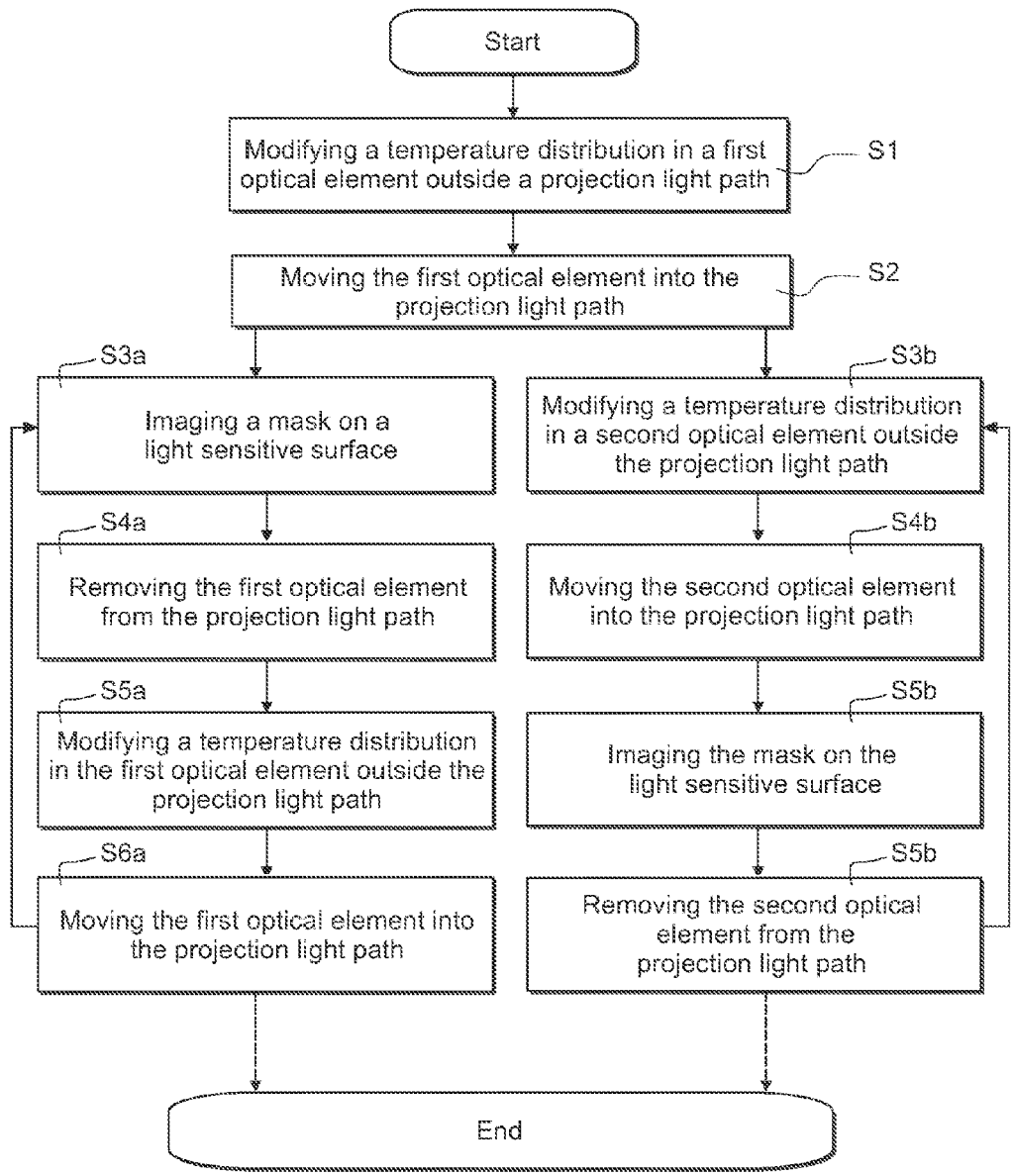
FIG. 11 a flow diagram that illustrates important method steps of the present disclosure.

FIG. 11 is a flow diagram that illustrates important steps of the method in accordance with the present disclosure.

In a first step S1 a temperature distribution in a first optical element is modified outside a projection light path.

In a second step S2 the first optical element moves into the projection light path.

In a third step S3a a mask is imaged on a light sensitive surface. Simultaneously, in a step S3b, a temperature distribution in a second optical element arranged outside a projection light path is modified.

In a fourth step S4a the first optical element is removed from the projection light path. Simultaneously, in a step S4b, the second optical element moves into the projection light path.

In a fifth step S5a a temperature distribution in the first optical element arranged outside a projection light path is modified. Simultaneously, in a step S5b, the mask is imaged on the light sensitive surface.

In a sixth step S6a the first optical element moves into the projection light path. Simultaneously, in a step S6b, the second optical element is removed from the projection light path.

Then the steps S3a, S3b to S6a, S6b are repeated n times, with n being a positive integer.

What is claimed is:
1. An apparatus, comprising:
a mask stage configured to hold a mask;

an illumination system configured to illuminate the mask with projection light;
a substrate stage configured to hold a substrate supporting a light sensitive surface;
a projection objective configured to image at least a portion of the mask illuminated by the projection light onto the light sensitive surface; and
a correction device, comprising:
   a first optical element;
   a second optical element;
   a drive mechanism configured to move the first and second optical elements between a first arrangement and a second arrangement; and
   a temperature control device,
wherein:
   in the first arrangement, the first optical element is an inner optical element having at least a portion in a projection light path, and the second optical element is an outer optical element completely outside the projection light path;
   in the second arrangement, the second optical element is the inner optical element having at least a portion in the projection light path, and the first optical element is the outer optical element completely outside the projection light path; and
   the temperature control device is configured to modify a temperature distribution in the outer optical element.

2. The apparatus of claim 1, wherein the drive mechanism is configured such that the inner optical element is spaced apart by less than 50 mm from the mask along an optical axis of the projection objective.

3. The apparatus of claim 1, wherein:
the mask stage is configured to displace the mask along a scan direction;
the substrate stage is configured to displace the substrate synchronously with the mask; and
the drive mechanism is configured to displace the inner optical element synchronously with the mask.

4. The apparatus of claim 3, wherein the drive mechanism is configured to be mechanically coupled to the mask stage.

5. The apparatus of claim 1, wherein the temperature control device comprises:
a cooling unit configured to cool the outer optical element; and
a heating unit configured to heat portions of the outer optical element to generate a variable temperature distribution in the outer optical element.

6. The apparatus of claim 5, wherein the heating unit comprises a radiation source configured to direct heating radiation on the outer optical element.

7. The apparatus of claim 1, wherein:
the first and second optical elements comprise plates;
the plates have plane and parallel refractive surface; and
the plates comprise material that is transparent to the projection light.

8. The apparatus of claim 1, further comprising:
a sensor configured to output measurement signals; and
a control unit configured to produce control signals for the temperature control device depending on the measurement signals output by the sensor.

9. The apparatus of claim 8, wherein the light-sensitive material comprises a resist material, and the sensor is configured to measure a thickness of the resist material at a plurality of points.

10. The apparatus of claim 8, wherein the sensor is configured to measure a position of a plurality of points on the mask.

11. The apparatus of claim 1, wherein the correction device is configured to correct optical wavefront deformations.

12. An apparatus, comprising:
a projection objective configured to image at least a portion of an object plane onto an image plane surface; and
a correction device upstream of the projection objective in a projection light path, the correction device comprising:
   a first optical element;
   a second optical element;
   a drive mechanism configured to move the first and second optical elements between a first arrangement and a second arrangement; and
   a temperature control device,
wherein:
   in the first arrangement, at least a portion the first optical element is in the projection light path, and the second optical element is completely outside the light path;
   in the second arrangement, at a portion of the second optical element is in the projection light path, and the first optical element is completely outside the projection light path;
   the temperature control device is configured to modify a temperature distribution a first member that is at least partially in the projection light path; and
   the first member is selected from the group consisting of the first optical element and the second optical element.

13. The apparatus of claim 12, wherein the drive mechanism is configured such that the member is spaced apart by less than 50 mm from the object plane along an optical axis of the projection objective.

14. The apparatus of claim 12, wherein:
a second member is selected from the group consisting of the first optical element and the second optical element;
the second member is different from the first member; and
the temperature control device comprises:
   a cooling unit configured to cool the second member; and
   a heating unit configured to heat portions of the second member to generate a variable temperature distribution in the second members.

15. The apparatus of claim 14, wherein the heating unit comprises a radiation source configured to direct heating radiation on the second member.

16. The apparatus of claim 12, wherein the correction device is configured to correct optical wavefront deformations.

17. A method, comprising:
a) modifying a temperature distribution in a first optical element while it is arranged outside a projection light path of the microlithographic projection exposure apparatus;
b) moving the first optical element into the projection light path;
c) illuminating a mask with projection light and imaging the mask onto a light sensitive surface;
d) during c), modifying a temperature distribution in a second optical element while it is arranged outside the projection light path; and e) after c), removing the first optical element from the projection light path and moving the second optical element into the projection light path.

18. The method of claim 17, wherein the method corrects optical wavefront deformations in the microlithographic projection exposure apparatus.

19. The method of claim 17, wherein, the first and the second optical elements are, while they are arranged in the projection light path, spaced apart by less than 50 mm from the mask along an optical axis of a projection objective of the microlithographic projection exposure apparatus.

20. The method of claim 17, further comprising, during c), synchronously moving the mask, a substrate supporting a light sensitive surface, and the first optical element.

21. The method of claim 17, further comprising, during a) and d):
   cooling the first and second optical elements, respectively, via a cooling unit; and
   heating the first and second optical elements, respectively, via a heating unit,
   thereby generating a variable temperature distribution in the first and second optical element, respectively.

22. The method of claim 17, further comprising:
   f) repeating c).

23. The method of claim 22, further comprising:
   g) during f), repeating a);
   h) after f), removing the second optical element from the projection light path;
   i) repeating b) and c); and
   j) repeating d) to i) n times,
   wherein n is a positive integer.

24. The method of claim 22, further comprising:
   g) during f), modifying a temperature distribution in a third optical element while it is arranged outside the projection light path;
   h) after f), removing the second optical element from the projection light path and moving the third optical element into the projection light path;
   i) repeating c); and
   j) repeating a) to i) n times,
   wherein n is a positive integer.

* * * * *

UNITED STATES PATENT AND TRADEMARK OFFICE
CERTIFICATE OF CORRECTION

PATENT NO. : 9,684,251 B2
APPLICATION NO. : 15/056085
DATED : June 20, 2017
INVENTOR(S) : Joerg Holzmann, Robert Weiss and Toralf Gruner Page 1 of 1

It is certified that error appears in the above-identified patent and that said Letters Patent is hereby corrected as shown below:

In the Claims

Column 18, Line 22, Claim 12, after "portion", insert -- of --.

Signed and Sealed this
Eighth Day of August, 2017

Joseph Matal
*Performing the Functions and Duties of the*
*Under Secretary of Commerce for Intellectual Property and*
*Director of the United States Patent and Trademark Office*